US011871565B2

(12) United States Patent
Wang et al.

(10) Patent No.: US 11,871,565 B2
(45) Date of Patent: Jan. 9, 2024

(54) METHODS OF SEMICONDUCTOR DEVICE FABRICATION

(71) Applicant: Yangtze Memory Technologies Co., Ltd., Wuhan (CN)

(72) Inventors: Qiguang Wang, Wuhan (CN); Gonglian Wu, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 16 days.

(21) Appl. No.: 17/462,806

(22) Filed: Aug. 31, 2021

(65) Prior Publication Data

US 2021/0399000 A1 Dec. 23, 2021

Related U.S. Application Data

(60) Division of application No. 16/689,478, filed on Nov. 20, 2019, now Pat. No. 11,183,508, which is a (Continued)

(51) Int. Cl.
*H10B 41/27* (2023.01)
*G11C 5/02* (2006.01)
(Continued)

(52) U.S. Cl.
CPC .............. *H10B 41/27* (2023.02); *G11C 5/025* (2013.01); *H10B 43/27* (2023.02); *H10B 99/00* (2023.02)

(58) Field of Classification Search
CPC ........ H10B 41/27; H10B 43/27; H10B 99/00; H10B 41/35; H10B 43/35; G11C 5/025;
(Continued)

(56) References Cited

U.S. PATENT DOCUMENTS 9,570,463 B1* 2/2017 Zhang .................... H10B 43/27
10,217,758 B2 2/2019 Oh
(Continued)

FOREIGN PATENT DOCUMENTS

CN 106057636 A 10/2016
CN 106067418 A 11/2016
(Continued)

OTHER PUBLICATIONS

Australian Office Action dated Jan. 12, 2022 in Patent Application No. 2019455154, 3 pages.
(Continued)

*Primary Examiner* — Mohammed Shamsuzzaman
(74) *Attorney, Agent, or Firm* — Oblon, McClelland, Maier & Neustadt, L.L.P.

(57) ABSTRACT

Aspects of the disclosure provide a method to manufacture a semiconductor device. The method includes filling a sacrificial layer in a first via of a first stack. An initial top CD is larger than an initial bottom CD of the first via. A second stack is formed along a vertical direction over the first stack. A third stack is formed along the vertical direction over the second stack. The first stack, the second stack, and the third stack include alternating insulating layers and gate layers. The insulating layers of the second stack etch at a faster rate than the insulating layers of the third stack and the gate layers of the second stack etch at a faster rate than the gate layers of the third stack. A first via, a second via, and a third via are formed in the first stack, the second stack, and the third stack, respectively.

16 Claims, 9 Drawing Sheets

Related U.S. Application Data continuation of application No. PCT/CN2019/093603, filed on Jun. 28, 2019.

(51) Int. Cl.
*H10B 43/27* (2023.01)
*H10B 99/00* (2023.01)

(58) Field of Classification Search
CPC ......... H01L 21/02112; H01L 21/02318; H01L 21/28238
See application file for complete search history.

(56) References Cited

U.S. PATENT DOCUMENTS

| | | | |
|---|---|---|---|
| 10,483,272 B2 | 11/2019 | Oh | |
| 10,553,609 B2 * | 2/2020 | Lee | H01L 21/76802 |
| 10,892,277 B2 * | 1/2021 | Xiao | H01L 21/0228 |
| 10,903,234 B2 * | 1/2021 | Yun | H10B 43/27 |
| 10,930,669 B2 * | 2/2021 | Hu | H10B 43/10 |
| 10,950,624 B2 * | 3/2021 | Baek | H10B 43/27 |
| 2011/0065270 A1 * | 3/2011 | Shim | H10B 43/27 257/E21.613 |
| 2013/0203227 A1 | 8/2013 | Huo et al. | |
| 2014/0273462 A1 | 9/2014 | Simsek-Ege et al. | |
| 2015/0132906 A1 | 5/2015 | Chang et al. | |
| 2015/0279855 A1 * | 10/2015 | Lu | H10B 43/27 438/269 |
| 2016/0225781 A1 | 8/2016 | Son et al. | |
| 2017/0110473 A1 * | 4/2017 | Lee | H01L 21/76897 |
| 2017/0154892 A1 * | 6/2017 | Oh | H10B 41/27 |
| 2017/0179152 A1 | 6/2017 | Toyama et al. | |
| 2018/0053774 A1 * | 2/2018 | Sakamoto | H01L 29/40114 |
| 2018/0076214 A1 | 3/2018 | Lim et al. | |
| 2018/0350830 A1 * | 12/2018 | Lim | H01L 29/1037 |
| 2019/0139975 A1 | 5/2019 | Oh | |
| 2019/0378856 A1 * | 12/2019 | Park | H10B 43/35 |
| 2020/0273881 A1 * | 8/2020 | Kim | H10B 41/10 |

FOREIGN PATENT DOCUMENTS

| | | |
|---|---|---|
| CN | 106653684 A | 5/2017 |
| CN | 106816442 A | 6/2017 |
| CN | 106887435 A | 6/2017 |
| CN | 106920798 A | 7/2017 |
| CN | 107316807 A | 11/2017 |
| CN | 106987272 A | 12/2018 |
| CN | 109256384 A | 1/2019 |
| CN | 109300906 A | 2/2019 |
| CN | 109496358 A | 3/2019 |
| CN | 109712987 A | 5/2019 |
| CN | 109887918 A | 6/2019 |
| CN | 109920790 A | 6/2019 |
| JP | 2010-67745 A | 3/2010 |
| JP | 2018-41895 A | 3/2018 |
| JP | 2018-49935 A | 3/2018 |
| KR | 10-2017-0131121 A | 11/2017 |

OTHER PUBLICATIONS

Indian Office Action dated Apr. 1, 2022 Indian in Patent Application No. 20212707840, 6 pages.
Supplementary European Search Report dated Apr. 21, 2022 in European Patent Application No. 19934705.5, citing reference 1 therein, 9 pages.
International Search Report and Written Opinion of the International Searching Authority dated Mar. 27, 2020 in PCT/CN2019/093603, 10 pages.
Combined Chinese Office Action and Search Report dated Oct. 14, 2020 in corresponding Chinese Patent Application No. 201980001291.7 (with English Translation of Category of Cited Documents), 10 pages.
Y. Ye et al., "Investigation of Reducing Bow during High Aspect Ratio Trench Etching in 3D NAND Flash Memory", Web of Science, 3D NAND and Etch Rate, 3 pages.
Zhang Wei, "Development Status of Advanced Integrated Circuit Technology", Research and Design, Advanced integrated circuit technology development Situation Analysis, 2017, pp. 22-27.
Office Action dated Jul. 25, 2023, in Japanese Patent Application No. 2021-568841, 3 pages

* cited by examiner

METHODS OF SEMICONDUCTOR DEVICE FABRICATION

RELATED APPLICATION

This application is a divisional application of U.S. patent application Ser. No. 16/689,478, "METHODS OF SEMICONDUCTOR DEVICE FABRICATION" filed Nov. 20, 2019, which is a bypass continuation of International Application No. PCT/CN2019/093603, filed on Jun. 28, 2019. The entire disclosures of the prior applications are hereby incorporated by reference in their entirety.

BACKGROUND

As critical dimensions of devices in integrated circuits shrink to the limits of common memory cell technologies, techniques are developed to achieve greater storage capacity. Compared to a planar transistor structure, a vertical structure of the 3D NAND memory devices is involved with more complex manufacturing processes. As the 3D NAND memory devices migrates to configurations with more memory cell layers to achieve higher densities at a lower cost per bit, it becomes an increasing challenge to improve structures and methods for manufacturing the same.

SUMMARY

According to aspects of the disclosure, a semiconductor device includes a string of transistors stacked in a vertical direction over a substrate of the semiconductor device having a channel structure extending in the vertical direction. The string of transistors including first, second, and third substrings of transistors that are arranged along first, second, and third portions of the channel structure, respectively. Gate structures of transistors in the first, second, and third substring are separated by respective first, second, and third insulating layers and the second insulating layers have a higher etch rate than that of the third insulating layers.

In an embodiment, a discontinuity between a critical dimension (CD) at a bottom side of the second portion of the channel structure and a CD at a top side of the first portion of the channel structure is less than a threshold. A discontinuity between a CD at a bottom side of the third portion of the channel structure and a CD at a top side of the second portion of the channel structure is less than the threshold. The threshold can be between 0.05 and 0.15.

In an embodiment, a volumetric mass density of the second insulating layers is lower than that of the third insulating layers. In an example, the second insulating layers are silicon oxide formed by a high density plasma chemical vapor deposition and the third insulating layers are silicon oxide formed based on tetraethoxysilane (TEOS).

In an embodiment, a material composition of the second insulating layers is different from that of the third insulating layers.

In an example, a ratio of a number of transistors in the second substring over a sum of the number of transistors in the second substring and a number of transistors in the third substring is between 10 and 30%. The first insulating layers and the third insulating layers can have a substantially identical etch rate.

According to aspects of the disclosure, a method for manufacturing a semiconductor device includes filling a sacrificial layer in a first via of a first stack including alternating first insulating layers and first gate layers where the first stack is over a substrate of the semiconductor device and an initial top CD (CD2init) is larger than an initial bottom CD (CD1init) of the first via. The method includes forming, along a vertical direction over the first stack, a second stack including alternating second insulating layers and second gate layers and forming, along the vertical direction over the second stack, a third stack including alternating third insulating layers and third gate layers. The second insulating layers etch at a faster rate than the third insulating layers and the second gate layers etch at a faster rate than the third gate layers. The method further includes forming a via in the first, second, and third stacks, the via including first, second, and third vias in the respective first, second, and third stacks.

In an embodiment, forming the via further includes removing portions of the second and third stack to form a combined via including the second and third vias where the combined via is above the first via, an initial bottom CD (CD3init) of the combined via is less than CD2init, and an initial discontinuity is between CD2init) and CD3init. Forming the via further includes etching an additional portion of the second stack to enlarge the second via and to reduce the initial discontinuity to a final discontinuity between a final bottom CD of the combined via and a final top CD of the first via where the second insulating layers etch at a faster rate than the third insulating layers and the second gate layers etch at a faster rate than the third gate layers. Forming the via further includes removing the sacrificial layer from the first via.

In an example, forming the via further includes while etching the additional portion of the second stack, removing an additional portion of the third stack where a discontinuity between a CD at a bottom side of the third via and a CD at a top side of the second via is smaller than the initial discontinuity between CD2init and CD3init.

In an embodiment, a volumetric mass density of the second gate layers is lower than that of the third gate layers. In an example, forming the second stack includes depositing silicon oxide as the second insulating layers and polysilicon as the second gate layers by a high density plasma chemical vapor deposition and forming the third stack includes forming silicon oxide as the third insulating layers from TEOS and silicon nitride as the third gate layers.

In an embodiment, a material composition of the second gate layers is different that of the third gate layers.

In an embodiment, the method further includes forming a channel structure including a channel layer and a gate dielectric structure in the via where the channel structure includes first, second, and third portions in the first, second, and third vias, respectively. The method includes forming first, second, and third gate structures by replacing the first, second, and third gate layers with a gate metal material, respectively where the first, second, and third portions of the channel structures and the corresponding first, second, and third gate structures form first, second, and third substrings of transistors of a string of transistors, respectively.

In an example, the first gate layers and the third gate layers have a substantially identical etch rate.

According to aspects of the disclosure, a method for manufacturing a semiconductor device includes forming a second stack in a vertical direction over a first stack where the second stack including alternating second insulating layers and second gate layers. The method further includes forming, along the vertical direction over the second stack, a third stack including alternating third insulating layers and third gate layers where the second insulating layers etch at a faster rate than the third insulating layers and the second gate layers etch at a faster mate than the third gate layers and forming a via in the first, second, and third stacks. The via includes first, second, and third vias in the respective first, second, and third stacks. In an example, a discontinuity between a CD at a bottom side of the second via and a CD at a top side of the first via is less than a threshold. In an example, a discontinuity between a CD at bottom side of the third via and a CD at a top side of the second via is less than the threshold.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
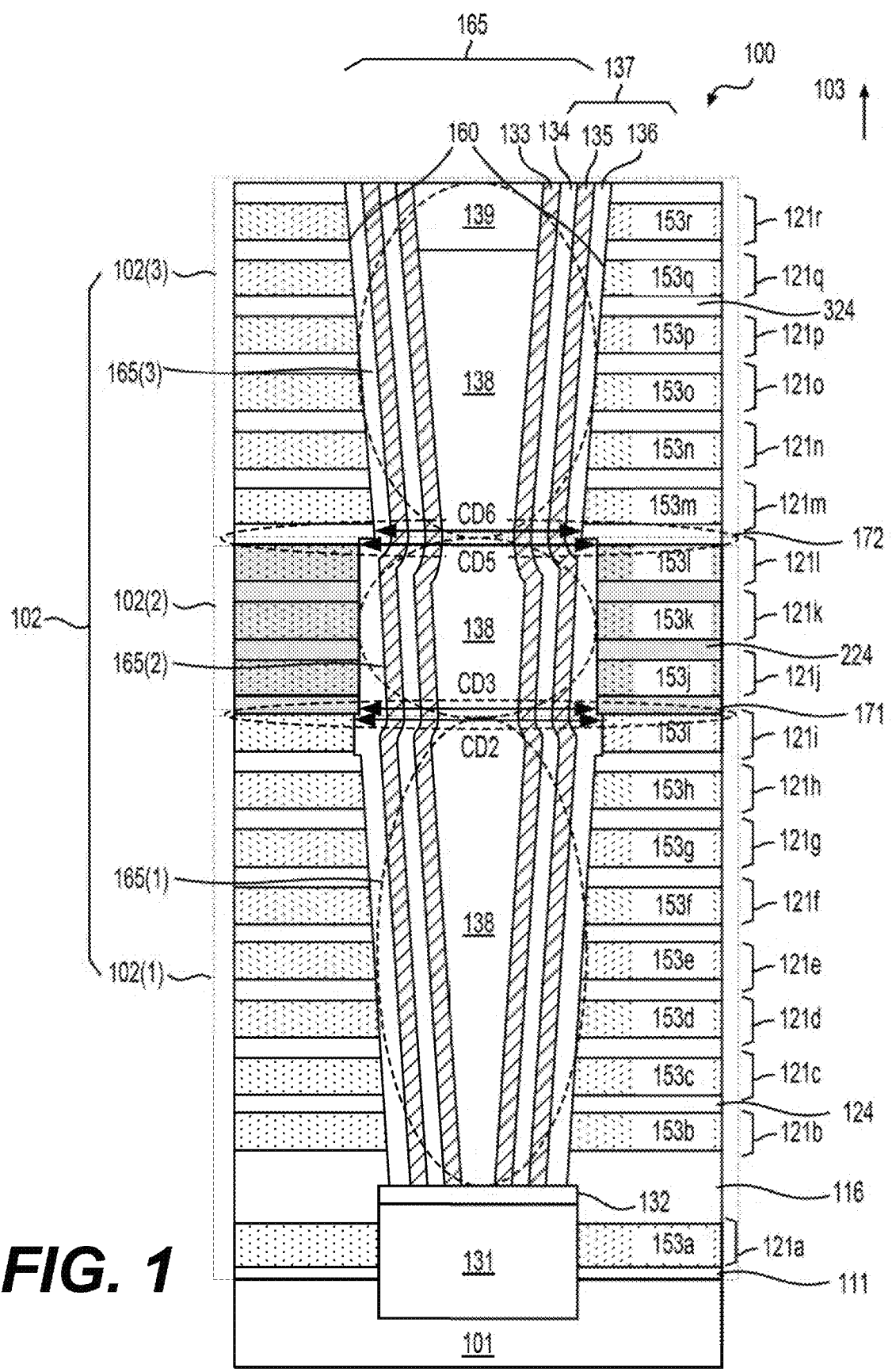
FIG. 1 shows a cross-section view of a portion of a semiconductor device 100 in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A string of transistors can be formed in a semiconductor device by forming a stack including alternating insulating layers and gate layers, forming a via in the stack, and forming a channel structure along a sidewall of the via that extend along a vertical direction. As a transistor density (i.e., a number of transistors per unit area) increases and the via becomes deeper, the via can be formed using multiple etching processes, for example, to form a lower and an upper portion of the via. However, a width discontinuity (also referred to as a discontinuity) can occur at a boundary separating the lower and upper portions of the via, resulting in a sharp edge or a staircase profile on the sidewall of the via. Accordingly, layers in the channel structure that are formed subsequently can have non-uniform thicknesses near the boundary and thus device performance of the semiconductor device may be negatively affected.

In order to optimize the device performance, an additional etch process can be performed to reduce the discontinuity and result in a smoother edge. To achieve this result, a portion of the stack near the boundary can be made from one or more materials that have a different etch rate than that of another portion of the stack.

FIG. 1 shows a cross-sectional view of as portion of a semiconductor device 100 in accordance with exemplary embodiments of the disclosure. The semiconductor device 100 includes a plurality of strings of transistors 102 over a substrate 101. Each string 102 includes multiple transistors, such as transistors 121b-121q, stacked along a vertical direction 103 above the substrate 101 to increase the transistor density. The string 102 has a channel structure 165 formed along a sidewall 160 along a via (not shown) in the string 102. The channel structure 165 extends along the vertical direction 103. As shown, the vertical direction 103 can be perpendicular to a working surface or side of the substrate 101.

The string 102 includes a first substring 102(1), a second substring 102(2), and a third substring 102(3) that are arranged along a first portion 165(1), a second portion 165(2), and a third portion 165(3) of the channel structure 165, respectively. Gate structures 153b-153q of the transistors 121b-121q in the first substring 102(1), the second substring 102(2), and the third substring 102(3) are separated by respective first insulating layers 124, second insulating layers 224, and third insulating layers 324. The first, second, and third insulating layers 124, 224, and 324 can electrically isolate the gate structures 153b-153q from each other and other structures in the semiconductor device 100. The first, second, and third insulating layers 124, 224, and 324 can include any suitable insulating materials, such as silicon oxide, silicon carbon oxide (SiCO), silicon germanium oxide (SiGeO2).

According to aspects of the disclosure, during an etching process, an etch rate of the second insulating layers 224 is higher than an etch rate of the third insulating layers 324. A volumetric mass density (also referred to as a density or a film density) of the second insulating layers 224 can be lower than a density of the third insulating layers 324, and thus the etch rate of the second insulating layers 224 can be higher than the etch rate of the third insulating layers 324. For example, the second insulating layers 224 is silicon oxide formed by a high density plasma chemical vapor deposition (CVD), and thus is less dense than the third insulating layers 324, e.g., silicon oxide formed based on tetraetboxysilane (TEOS). Alternatively or additionally, a material composition of the second insulating layers 224 is different from that of the third insulating layers 324, and etches at a faster rate than the third insulating layers 324. The second insulating layers 224 can be formed from material(s), such as SiCO, SiGeO2, and the like, that are different from material(s), such as silicon oxide, of the third insulating layer 324 where SiCO and SiGeO2 have higher etch rates than that of silicon oxide.

In an embodiment, the density of the second insulating layers 224 can also be lower than a density of the first insulating layers 124 and/or the material composition of the second insulating layers 224 can also be different from that of the first insulating layers 124, and thus the etch rate of the second insulating layers 224 is higher than an etch rate of the first insulating layers 124.

In an example, the first and third insulating layers 124 and 324 have a substantially identical thickness and a material composition, and thus a substantially identical etch rate. Therefore, the etch rate of the second insulating layers 224 is higher than those of the first and third insulating layers 124 and 324.

The first, second, and third insulating layers 124, 224, and 324, can have any suitable thicknesses, such as between 20 and 40 nm, according to desired characteristics of the semiconductor device 100. In an example, the first, second, and third insulating layers 124, 224, and 324, can have substantially identical thicknesses, such as 25 nm.

According to aspects of the disclosure, discontinuities in the string 102, such as a discontinuity Δd1 at a boundary 171 between the first and second substrings 102(1)-(2) and a discontinuity Δd2 at a boundary 172 between the second and third substrings 102(2)-(3), are less than a threshold. In an example, a discontinuity Δd at a boundary can be represented as Δd=|(W'−W)|/W, where W' and W represent a critical dimension (CD)) above and below the boundary, respectively. In an embodiment, the CD can refer to a distance between opposite sides of the sidewall 160. Accordingly, the discontinuity Δd1 can be represented as Δd1=|(CD3−CD2)|/CD2, where CD3 and CD2 represent critical dimensions above and below the first boundary 171, respectively. CD3 can represent a critical dimension at a bottom side of the second portion 165(2) and CD2 can represent a critical dimension at a top side of the first portion 165(1). Similarly, the discontinuity Δd2 can be represented as Δd2=|(CD6−CD5)|/CD5, where CD6 and CD5 represent critical dimensions above and below the second boundary 172, respectively. CD6 can represent a critical dimension at a bottom side of the third portion 165(3) and CD5 can represent a critical dimension at a top side of the second portion 165(2). The threshold can be between 0.05 and 0.15. In an example, the threshold is 01.1. Depending on processes to manufacture the string 102, additional discontinuities can occur. According to aspects of the disclosure, the additional discontinuities are also less than the threshold, and thus the sidewall 160 are relatively smooth and thicknesses of the layers in the channel structure 165 near the boundaries 171-172 are relatively uniform.

Referring to FIG. 1, the first substring 102(1) including the transistors 121b-121i is formed over the substrate 101 and is arranged along the first portion 165(1) of the channel structure 165 (also referred to as the first portion 165(1)). The transistors 121b-121i further include the respective gate structures 153b-153i that are adjacent to the first portion 165(1). The second substring 102(2) including the transistors 121j-121l is stacked over the first substring 102(1) and is arranged along the second portion 165(2) of the channel structure 165 (also referred to as the second portion 165(2)). The transistors 121j-121l further include the respective gate structures 153j-153l that are adjacent to the second portion 165(2). The third substring 102(3) including the transistors 121m-121q is stacked over the second substring 102(2) and is arranged along the third portion 165(3) of the channel structure 165 (also referred to as the third portion 165(3)). The transistors 121m-121q further include the respective gate structures 153m-153q that are adjacent to the third portion 165(3).

In an embodiment, the semiconductor device 100 is a nonvolatile memory device, such as three-dimensional (3D) AND flash memory device where the transistors 121b-121q are stacked along the vertical direction 103 to increase a storage density.

In some examples, the transistors 121b-121q are used as memory cells 121b-121q to store data. The string 102 can also include a first selection structure 121a and a second selection transistor 121r and that are connected in series with the memory cells 121b-121q. In general, to access individual transistors that store data in a memory device, additional circuits can be formed as described below. A bit line (not shown) can be connected to one side of the string 102, for example, via a second contact 139 associated with the second selection transistor 121r. A source line (not shown) can be connected to another side of the string 102, for example, via a first contact 131 associated with the first selection structure 121a. The second selection transistor 121r can be disposed between the bit line and the uppermost memory cell 121q. The first selection structure 121a can be disposed between the lowermost memory cell 121b and the source line. In some examples, multiple memory cells in a sane layer can be controlled by a word line (not shown) connected to respective gate structures. For example, the memory cells 121q can be controlled by a word line connected to the gate structures 153q, the memory cells 121p can be controlled by another word line, and the like.

In some embodiments (not shown in FIG. 1), the first selection structure 121a has similar or identical structure, dimension, and materials to those of the memory cells 121b-121q, however, the first selection structure 121a can be operated as a first selection transistor instead of a memory cell. In some embodiments, such as shown in FIG. 1, the first selection structure 121a has different structure and materials from those of the memory cells 121b-121q. The second selection transistor 121r can have similar or identical structure, dimension, and materials to those of the memory cells 121b-121q, however, the second selection transistor 121r can also be operated as the second selection transistor instead of a memory cell.

In addition to the second selection transistor 121r, one or more additional transistors can be disposed above the transistor 121r and used as the second selection transistors in the string 102. Similarly, in addition to the first selection structure 121a, one or more-additional selection structures can be disposed below the transistor 153b and used as the first selection structures in the string 102. In some embodiments, the first selection structure and the second selection transistors can have a structure similar or identical to that of the memory cells. In some embodiments, the first selection structures and the second selection transistors can have structures different from that of the memory cells. For example, a portion of a gate dielectric structure 137 corresponding to the second selection transistor 121r includes a blocking insulating layer while portions of the gate dielectric structure 137 corresponding to the transistors 121b-121q includes multiple dielectric layers, such as a tunnel insulating layer 134, a charge storage layer 135, and a blocking insulating layer 136.

In some embodiments, such as shown in FIG. 1, a gate structure 153a is a bottom select gate. In some examples, the first contact 131 is separated from the gate structure 151a by a dielectric layer (not shown in FIG. 1). The first contact 131 can further extend into the substrate 101. In some embodiments, a top surface of the first contact 131 is above a top surface of the gate structure 153a and below a bottom surface of the gate structure 153b. For example, the top surface of the first contact 131 is located at a middle positon between the top surface of the gate structure 153a and the bottom surface of the gate structure 153b. The second select transistor 121r includes a gate structure 153r. An oxide layer 132 can subsequently be formed over the first contact 131 by an oxidation process.

The channel structure 165 can have any suitable shape, dimension, and materials. Multiple channel structures 165 can be separately disposed from each other over the substrate 101 to form the multiple strings 102. In an example, the channel structure 165 has one or a combination of shapes extending in the vertical direction 103, such as a pillar shape, a cylindrical shape, a tapered cylindrical shape, and the like. Referring to FIG. 1, the channel structure 165 including multiple shapes for the first to third portions 165(1)-(3). The first and third portions 165(1) and 165(3) have tapered cylindrical shapes and the second portion 165(2) has a cylindrical shape.

The channel structure 165 can include the gate dielectric structure 137, a channel layer 133, and an insulating layer 138 that are sequentially formed along the sidewall 160 of the via. The gate dielectric structure 137 is disposed between the channel layer 133 and the gate structures 153a-153r. The gate dielectric structure 137 can extend in the vertical direction 103. The gate dielectric structure 137 can have any suitable shape(s), dimension, and materials. In an example, the gate dielectric structure 137 has one or a combination of shapes, such as a hollow cylindrical shape, a tapered hollow cylindrical shape, and the like.

In some embodiments, the gate dielectric structure 137 includes multiple dielectric layers, such as the tunnel insulating layer 134, the charge storage layer 135, and the blocking insulating layer 136 that are sequentially stacked over the channel layer 133. The memory cells 121b-121q can be floating-gate transistors where electric charges from the channel layer 133 can be transferred into the charge storage layer 135 via a quantum tunneling process through the tunneling insulating layer 134. The charge storage layer 135 (also referred to as a floating gate) can store data, e.g., the electric charges.

The channel layer 133 can have any suitable shape(s), dimension, and materials. In an example, the channel layer 133 has one or a combination of shapes extending in the vertical direction 103, such as a hollow cylindrical shape, a tapered hollow cylindrical shape, and the like. The channel layer 133 can include one or more semiconductor materials. The one or more semiconductor materials can be intrinsic, p-type doped, n-type doped, and the like. In an example, the channel layer 133 includes polysilicon. Referring to FIG. 1, the insulating layer 138 fills a space surrounded by the channel layer 133.

The gate structures 153a-153r can include conductive materials, such as metals. In some examples, the gate structures 153a-153r include a layer having high dielectric constant (high-K) material (also referred to as a high-K layer) and a metal layer, such as tungsten (W). Thicknesses of the gate structures 153a-153r can range from 20 to 50 nm, such as 35 nm. In an example, a lower insulating layer 111 is formed between the gate structure 153a and the substrate 101 and an insulating layer 116 is formed between the gate structures 153a and 153b. The gate structures 153a-153r can have any suitable thicknesses according to desired characteristics of the semiconductor device 100. For example, the thicknesses of the gate structures 153a-153r can be equal to one another or be different from one another.

The channel layer 133, the gate dielectric structure 137, and the gate structures 153b-153q form the respective transistors 121b-121q. In general, operations of the transistors 121b-121q, for example, where data are written into, erased from, and read from the memory cells 121b-121q, are controlled by applying suitable voltages to the respective gate structures 153b-153q.

In general, the channel layer 133 can be electrically connected to the first contact 131, and the first contact 131 can be electrically coupled to the substrate 101. The first contact 131 can include silicon (Si), such as monocrystalline Si. The channel layer 133 can be electrically connected to the bit line via the second contact 139 made of, for example, polysilicon.

Of course, any suitable number of memory cells can be formed in the string 102 and/or in each of the substrings 102(1)-(3), depending on a capacity of the semiconductor device 100. In an example, a first number of memory cells in the first substring 102(1) is equal to a sum of a second number of memory cells in the second substring 102(2) and a third number of memory cells in the third substring 102(3). A number of memory cells in the string 102 can be 64, 128, or the like, and thus, the first number and the sum of the second and third numbers are 32, 64, or the like. The second number can be smaller than the third number, and a ratio of the second number over the sum can be between 10 and 30%.

In some embodiments, the string 102 can include additional substrings stacked over the third substring 102(3). For example, a fourth substring and a fifth substring can be sequentially stacked over the third substring 102(3). The fourth substring can have identical or similar structures, dimensions, and the materials to the second substring 102(2) and the fifth substring can have identical or similar structures, dimensions, and the materials to the third substring 102(3).

FIGS. 2-8 are cross-sectional views of a portion of the semiconductor device 100 at various steps of a process according to exemplary embodiments of the disclosure. FIG. 9 shows a flow chart outlining a process 900 for semiconductor fabrication according to an embodiment of the disclosure. The process 900 can be used to fabricate the string 102 in the semiconductor device 100 shown in FIG. 1. As used herein, a semiconductor device can include transistors (e.g., field-effect transistors and floating-gate transistors), integrated circuits, a semiconductor chip (e.g., memory chip including a 3D NAND memory device, a logic chip on a semiconductor die), a stack of semiconductor chips, a semiconductor package, a semiconductor wafer, and the like.

Figure 2:
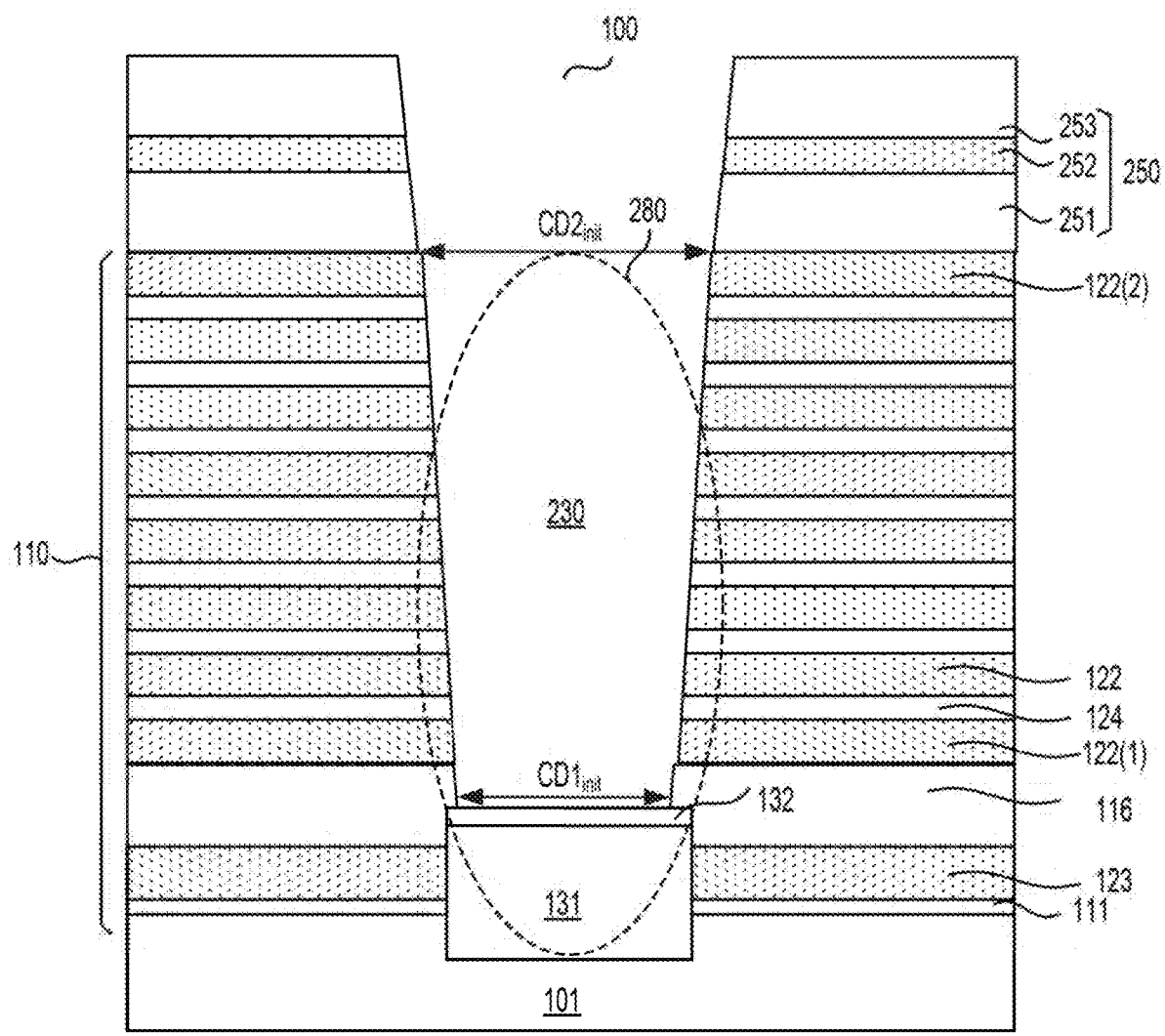
FIGS. 2-8 are cross-sectional views of a portion of the semiconductor device 100 at various steps of a process according to exemplary embodiments of the disclosure.

Referring to FIGS. 2 and 9, the process 900 starts at step S901 and proceeds to step S910. At step S910, a first stack can be formed over a substrate. As shown in FIG. 2, the first stack 110 includes alternate first gate layers 122 and first insulating layers 124. Multiple first substrings of transistors, such as the first substring 102(1), can be formed in the first stack 110. The substrate 101 can be any suitable substrate and can be processed with various suitable features. The substrate 101 can be formed of any suitable semiconductor material, such as silicon (Si), germanium (Ge), SiGe, a compound semiconductor, an alloy semiconductor, and the like. Additionally, the substrate 101 can include various layers, including conductive or insulating layers formed on a semiconductor substrate. The substrate 101 can be a silicon-on-insulator (SOI) substrate. Further, the substrate 101 can include an epitaxial layer formed can insulator. The substrate 101 can include various doping configurations depending on design requirements.

The first stack 110 can be manufactured using a variety of semiconductor processing techniques, such as photolithography, CVD including furnace CVD, low pressure CVD, and the like, physical vapor deposition (PVD), atomic layer deposition (ALD), dry etching, wet etching, chemical mechanical planarization (CMP), ion implantation, and the like.

The first stack 110 can further include one or more additional layers, such as the insulating layers 111 and 116 and a layer 123, between the substrate 101 and the lowermost gate layer 122(1). In some examples, the insulating layer 111 includes SiO2 having a thickness about 18 nm, the layer 123 includes silicon nitride having a thickness of 10 to 100 nm, the insulating layer 116 includes SiO2 having a thickness of 130-180 nm.

The first gate layers 122 and the first insulating layers 124 are alternately formed over the insulating layer 116 and can include, for example, any suitable dielectric materials that have different etch rates. For example, the first gate layers 122 can be formed with silicon nitride, the first insulating layers 124 can be formed by using a dielectric material, such as $SiO_2$, that has a different etch rate from that of the first gate-layers 122. In various embodiments, the layer 123 and the first gate layers 122 are removed and replaced with the respective gate structures 153a-153i subsequent steps.

As described above, in some examples, the gate structures 153b-153i correspond to word lines in the memory cells 121b-1.21i. Thicknesses of the first gate layers 122 can be different from or identical to each other. In an example, the thickness of the first gate layers 122 range from 20 to 50 nm, for example, the thickness of the first gate layers 122 can be about 35 nm. Any suitable deposition process, such as CVD, PVD, ALD, or any combination thereof, can be applied to form the first gate layers 122.

The first insulating layers 124 can have any suitable thicknesses, such as between 20 and 40 nm, and can be formed by performing CND, ALD, or any combination thereof. In an example, the thickness of the first insulating layers 124 is 2.5 nm.

In an example, a thickness of the first stack 110 can be about 1-10 microns, and more specifically 4-6 microns. Any suitable number of transistors or memory cells can be formed in the first stack 140, such as 16, 32, 64, 96, and the like. Accordingly, a number of the first gate layers 12 may vary according to the number of the memory cells 121b-121i in the first stack 110.

A mask layer or a sacrificial layer 250 can be formed and patterned over a topmost layer, such as the topmost first gate layer 122(2) as shown in FIG. 2, of the first stack 110 to protect the semiconductor device 100 during subsequent processing. The mask layer 250 can include one or more hard mask sublayers, such as silicon nitride and silicon oxide. Referring to FIG. 2, the mask layer 250 includes sublayers 251-253 where the sublayer 251 is silicon oxide, the sublayer 252 is silicon nitride, and the sublayer 253 is silicon oxide. In various embodiments, the mask layer 250 can be patterned according to any suitable techniques, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like.

An opening 280 extending into the substrate 101 can be formed according to the mask layer 250 using any suitable process. In an example, an upper portion of the substrate 101, portions of the insulating layers 111 and 116, the layer 123, the first gate layers 122, and the first insulating layers 124, exposed by the patterned mask layer 250, are removed to form the opening 280. The opening 280 is formed using an etching process, such as a wet etching, a dry etching such as a plasma etch referred to as a plasma punch, or a combination thereof.

The opening 280 can have any suitable shape, such as a circular pillar-shape, a square pillar-shape, an oval pillar-shape, and the like. The opening 280 can have a tapered profile where a top opening is larger than a bottom opening, as shown in FIG. 2. The tapered profile can be obtained by tapering a mask profile of the patterned mask layer 250, adjusting parameters of the etching process, and the like. A tapered profile can help subsequent deposition steps and improve sidewall coverage. In some examples, a subsequent plasma ashing and a wet clean can be applied to remove the remaining mask layer 250. In FIG. 2, the mask layer 250 remains over the first stack 110.

In various embodiments, the first contact 131 is formed from the substrate 101 in the opening 280. The first contact 131 can be formed using silicon deposited via a selective epitaxially growth technique. The first contact 131 can include monocrystalline Si. In an example, the first contact 131 has a thickness of 190 nm. In general, the oxide layer 132 can subsequently be formed over the first contact 131 by an oxidation process. For example, the oxide layer 132 includes silicon oxide with a thickness of 2-5 nm. A first via 230 is formed in the opening 280 and is above the first contact 131 and the oxide layer 132. In an example, a top CD, $CD2_{init}$, of the first via 230 can range from 90 to 160 nm, such as 120 nm, and a bottom CD, $CD1_{init}$, can range from 50 to 110 nm, such as 95 nm, and the first via 230 can have a tapered profile where $CD1_{init}$ is smaller than $CD2_{init}$.

Figure 3:
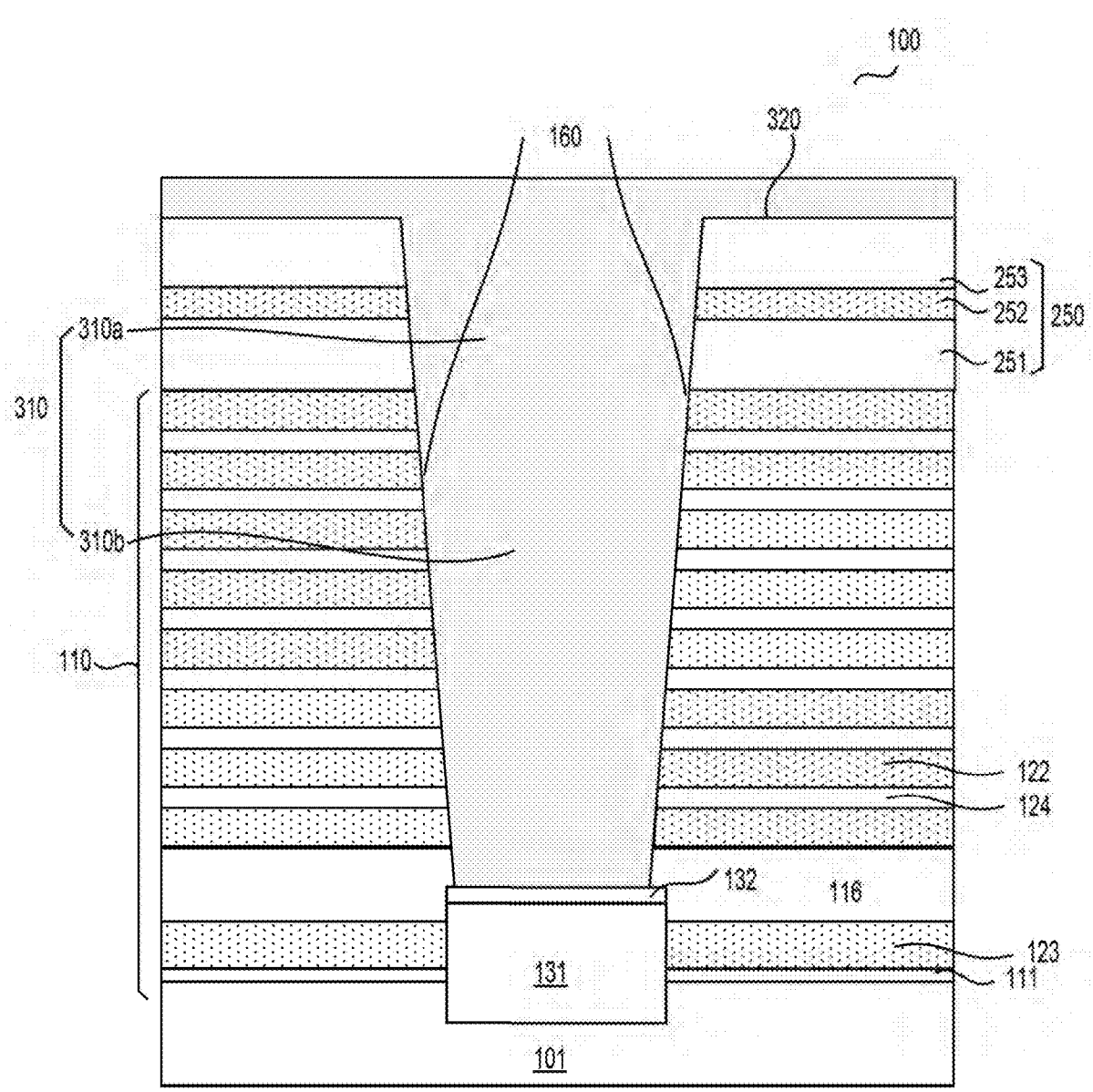

Referring to FIGS. 3 and 9, at step S920 of the process 900, the first via 230 is filled with a sacrificial layer 310. In an example, the sacrificial layer 310 includes a first portion 310a that is above the first stack 110 and a second portion 310b that fills the first via 230. In some examples, the first via 230 is fully covered, however, is partially filled by the second portion 310b. In the example shown in FIG. 3, the first via 230 is completely filled by the second portion 310b.

In general, the sacrificial layer 310 can be conformably formed by depositing one or more sacrificial materials over a top surface of the oxide layer 132. In various embodiments, the sacrificial layer 310 is also formed over a top surface 320 of the mask layer 250 and the sidewall 160 of the first via 230. The sacrificial layer 310 can be formed using any suitable process, such as an ALD process, a CND process, a PVD process, or a combination thereof. For example, the sacrificial layer 310 can be formed of polysilicon, tungsten, and the like. In an example, the sacrificial layer 310 is formed of polysilicon.

Figure 4:
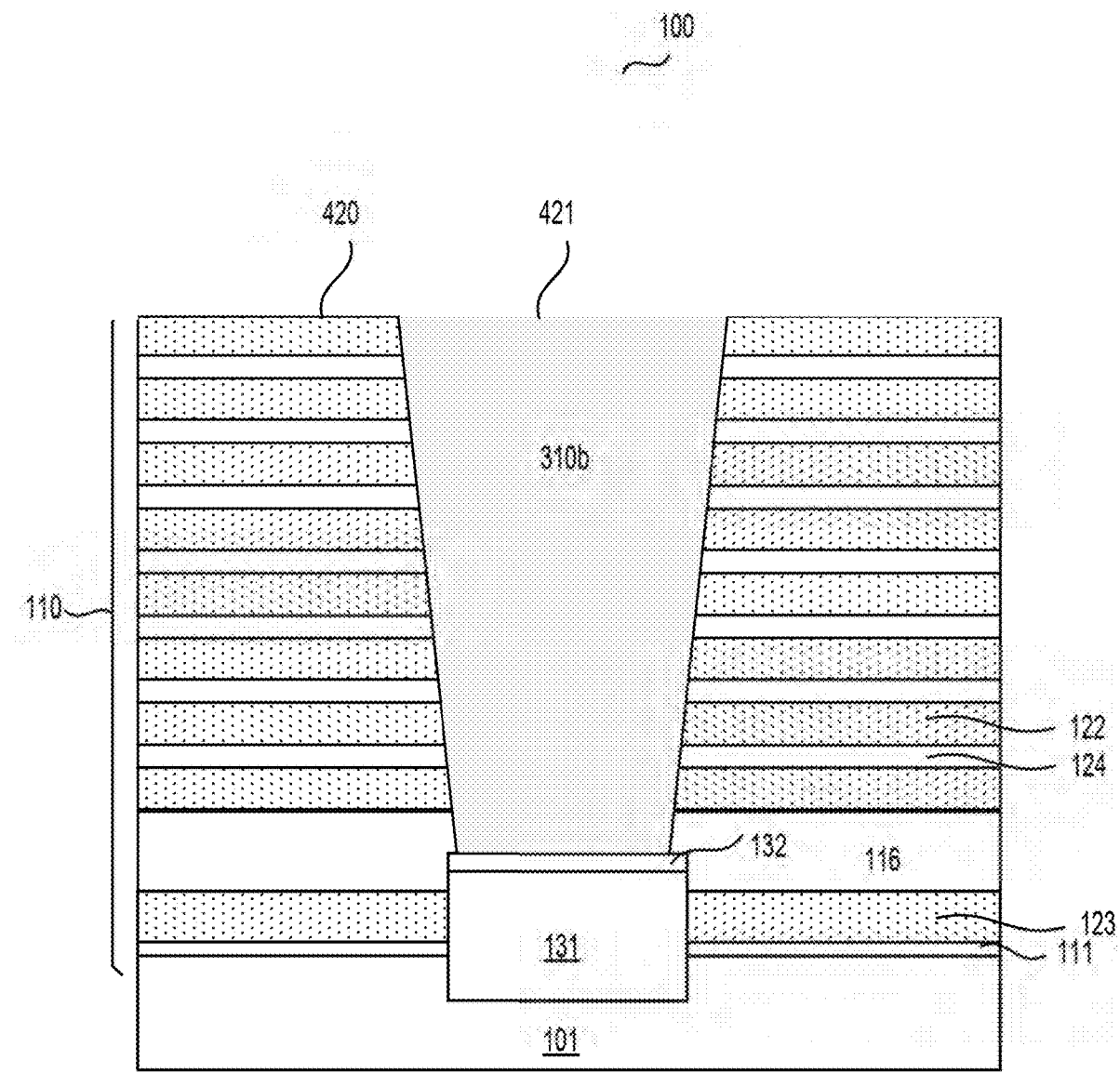

Referring to FIGS. 4 and 9, at step S930 of the process 900, a surface planarization process such as a CMP can be used to remove excessive semiconductor material deposited over a top surface 420 of the first stack 110. In various examples, the surface planarization process removes the first portion 310a. Accordingly, the top surface 420 of the first stack 110 and a top surface 421 of the second portion 310b are coplanar, facilitating subsequent formation of a second stack 120 over the first stack 110.

Figure 5:
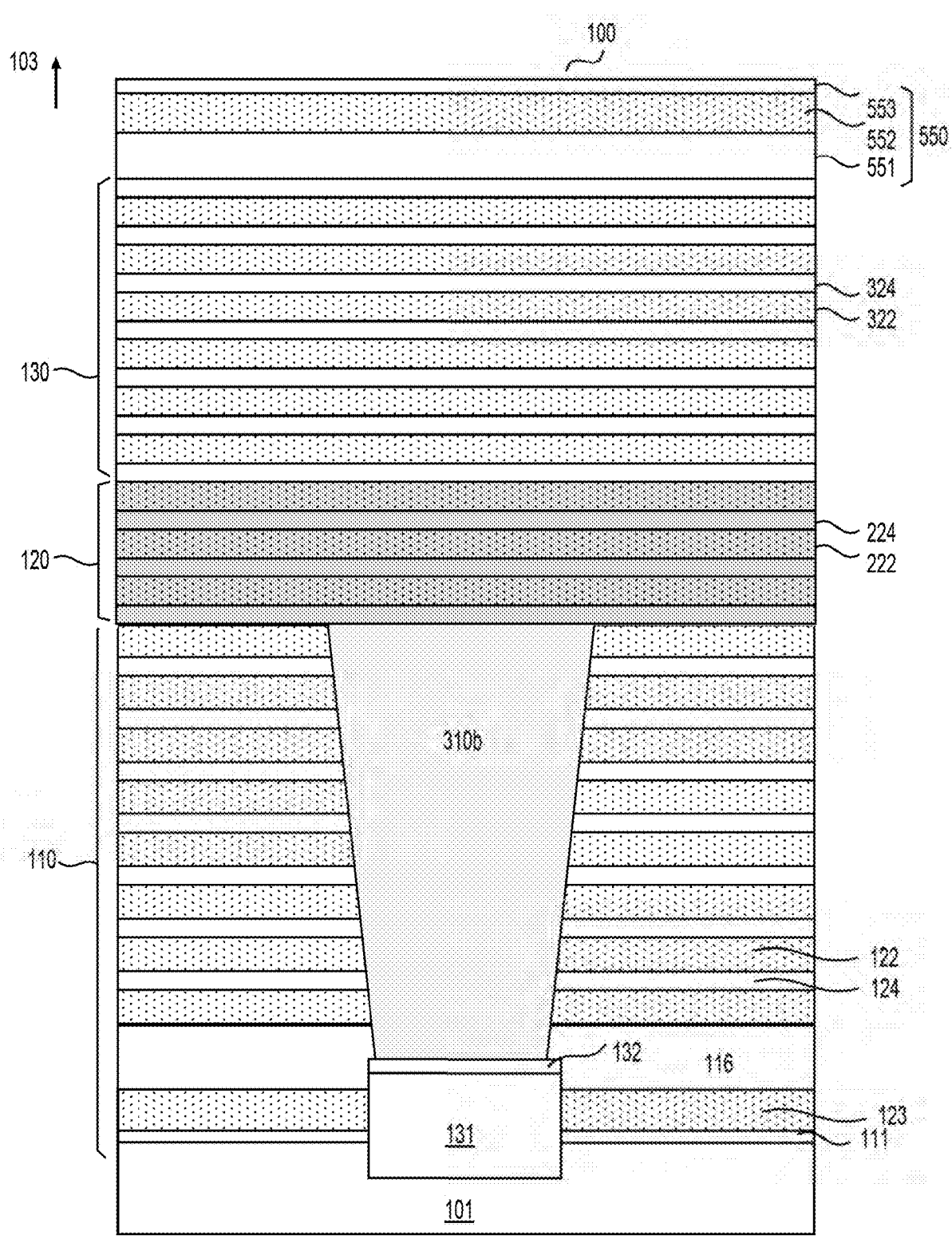

Referring to FIGS. 5 and 9, at step S940 of the process 900, the second stack 120 and a third stack 130 are formed over the first stack 110 along the vertical direction 103. The second stack 120 includes the second insulating layers 224 and second gate layers 222 alternately formed over the first stack 110. The third stack 130 includes the third insulating layers 324 and third gate layers 322 alternately formed over the second stack 120. Multiple second substrings, such as the second sub string 102(2), can be formed in the second stack 120, and multiple third substrings, such as the third substring 102(3), can be formed in the third stack 130. In an example, the respective first, second, and third substrings 102(1)-(3) are aligned along the vertical direction 103 to form the multiple strings 102 in a combined stack including the first, second, and third stacks 110, 120, and 130 of the semiconductor device 100. Any suitable deposition process, such as CVD, PVD, ALD, or any combination thereof, can be applied to form the second stack 120 and the third stack 130. In an embodiment, insulating layers 551-553 form a mask, a hardmask, or a sacrificial layer 550 above the third stack 130. The insulating layers 551-553 can include silicon oxide, silicon nitride, and the like.

In an embodiment, the third insulating layers 324 can have similar of identical materials, thicknesses and functions as those of the first insulating layers 124, and the third gate layers 322 can have similar or identical materials, thicknesses, and functions as those of the first gate layers 122. Therefore, detailed description of the materials, the thickness, and the functions of the third insulating and gate layers 324 and 322 is omitted for purposes of brevity. In an example, the third insulating layers 324 and the third gate layers 322 are formed using processes identical to those used for the first insulating layers 124 and the first gate layers 122, respectively. In an example, the second and third gate layers 222 and 322 can range from 20 to 50 nm, such as 35 nm.

According to aspects of the disclosure, the second stack 120 has a higher etch rate than that of the third stack 130 certain etching processes where the etch rate of the second insulating layers 224 is higher than the etch rate of the third insulating layers 324. An etch rate of the second gate layers 222 can be higher than an etch rate of the third gate layers 322. In an embodiment, the second insulating layers 224 and the second gate layers 222 are silicon oxide and polysilicon, respectively, and the third insulating layers 324 and the third gate layers 222 are silicon oxide and silicon nitride. In an example, silicon oxide in the second insulating layers 224 is formed by a high density plasma CVD and silicon oxide in the third insulating layers 324 is formed based on tetra-ethoxysilane (TEOS), and thus the third insulating layers 324 is denser than the second insulating layers 224. Polysilicon in the second gate layers 222 can be formed by low pressure (LP) CVD from silane (SiH4), disilane (Si2H6), or the like. Silicon nitride in the third gate layers 322 can be formed by LPCVD from silane, halosilane, or the like. Changing a deposition temperature when forming silicon nitride can tune a film density and the etch rate of the third gate layers 322. In an example, the deposition temperature of the silicon nitride is chosen such that the etch rate of the third gate layers 322 is less than that of the second gate layers 222. As a result, the third stack 130 is denser than the second stack 120. The material compositions of the second stack 120 can be different from those of the third stack 130, and the second stack 120 is etched faster than the third stack 130. The third insulating layers 324 and the third gate layers 322 can be silicon oxide and silicon nitride, respectively. The second insulating layers 224 and the second gate layers 222 can be SiCO and polysilicon, respectively. The second insulating layers 224 and the second gate layers 222 can also be SiGeO2 and silicon oxide nitride, respectively.

The second stack 120 can also have a higher etch rate than that of the first stack 110 in certain etching processes where the etch rate of the second insulating layers 224 is higher than the etch rate of the first insulating layers 124. An etch rate of the second gate layers 222 can also be higher than an etch rate of the first gate layers 122.

In various embodiments, the second and third gate layers 222 and 322 are removed and replaced with the gate structures 153$j$-153$r$ for the transistors 121$j$-121$r$ in subsequent steps. Subsequently, the first, second, and third substrings 102(1)-(3) can be formed based on the first, second, and third stacks 110, 120, and 130, respectively. The multiple strings 102 can be formed in the combined stack including the first, second, and third stacks 110, 120, and 130.

In an example, a sum of a second thickness of the second stack 120 and a third thickness of the third stack 130, is about 1-10 microns, such as 4-6 microns. The sum of the second number of the transistors formed in the second stack 120 and the third number of the transistors in the third stack 130 can be 32, 64, 96, and the like. A ratio of the second number over the sum can be between 10 and 30%. In an example, a number of the second insulating layers 224 can range from 10 to 20.

Figure 6:
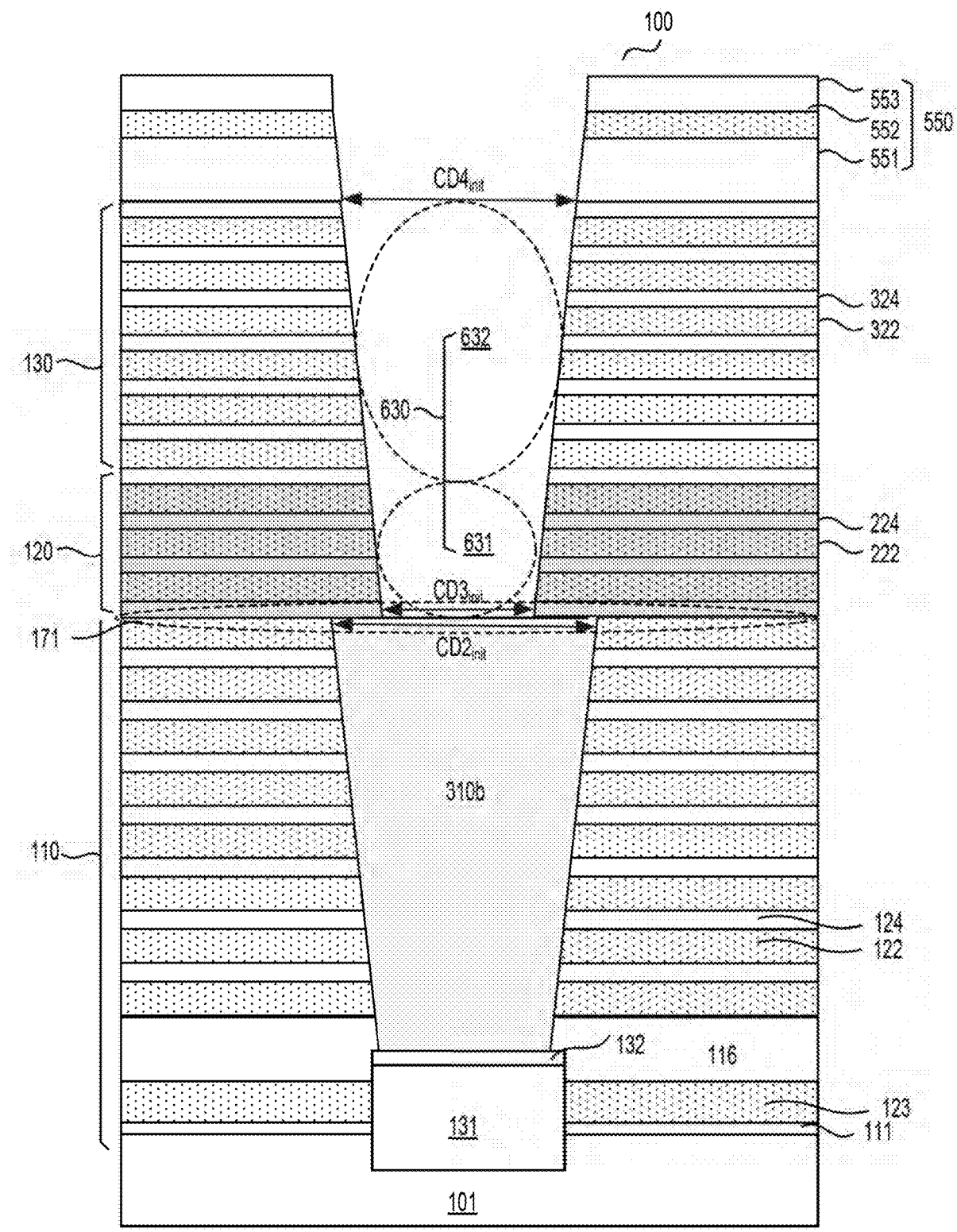

Referring to FIGS. 6 and 9, at step S950 of the process 900, a combined via 630 is formed over the first stack 110 by removing portions of the second stack 120 and the third stack 130 that are exposed by patterns of the mask layer 550. As shown, the combined via 630 includes a second via 631 and a third via 632 that are formed in the second stack 120 and the third stack 130, respectively. The combined via 630 can be formed using an etching process. In the example shown in FIG. 6, the combined via 630 is formed using a dry etching.

The combined via 630 can have any suitable shape and dimensions, for example, that are similar or identical to those of the first via 230. In an example shown in FIG. 6, the combined via 630 can have a tapered profile where a bottom CD (i.e., $CD3_{init}$) of the combined via 630 is smaller than a top CD (i.e., $CD4_{init}$) of the combined via 630. For example, $CD4_{init}$ can range from 90 to 160 nm, such as 120, and $CD3_{init}$ can range from 50 to 110 nm, such as 95 nm. $CD4_{init}$ is also a top CD of the third via 632 (i.e., an upper portion of the combined via 630) and $CD3_{init}$ is also a bottom CD of the second via 631 (i.e., a lower portion of the combined via 630). Accordingly, an initial discontinuity Δdinit at the boundary 171 is Δdinit=|($CD3_{init}$–$CD2_{init}$)|/$CD2_{init}$, where $CD3_{init}$ and $CD2_{init}$ are the critical dimensions above and below the boundary 171, respectively. As described above, multiple etching processes performed in the steps S910 and S960 can result in the tapered profiles of the first via 230 and the combined via 630 and accordingly the initial discontinuity Δdinit at the boundary 171 between the first via 230 and the second via 631. In an example, the initial discontinuity Δdinit can range between 0.15 and 0.35, such as 0.2, and resulting in a sharp edge. Therefore, the layers in the channel structure 165 formed in subsequent processes can have non-uniform thicknesses near the boundary 171 and the device performance may be negatively affected.

In order to reduce the initial discontinuity Δdinit at the boundary 171 and optimize the device performance, the second stack 120 that is near the boundary 171 can be made from one or more materials that have a different etch rate than that of the third stack 130, as described above. Referring to FIG. 6, $CD3_{init}$ is less than $CD2_{init}$, accordingly, an additional etch process near the boundary 171 can be performed to remove an additional portion from the second stack 120 so that $CD3_{init}$ is enlarged while $CD2_{init}$ is minimally affected. Therefore, the initial discontinuity Δdinit is reduced, resulting in a smoother edge, as shown in FIG. 7.

Figure 7:
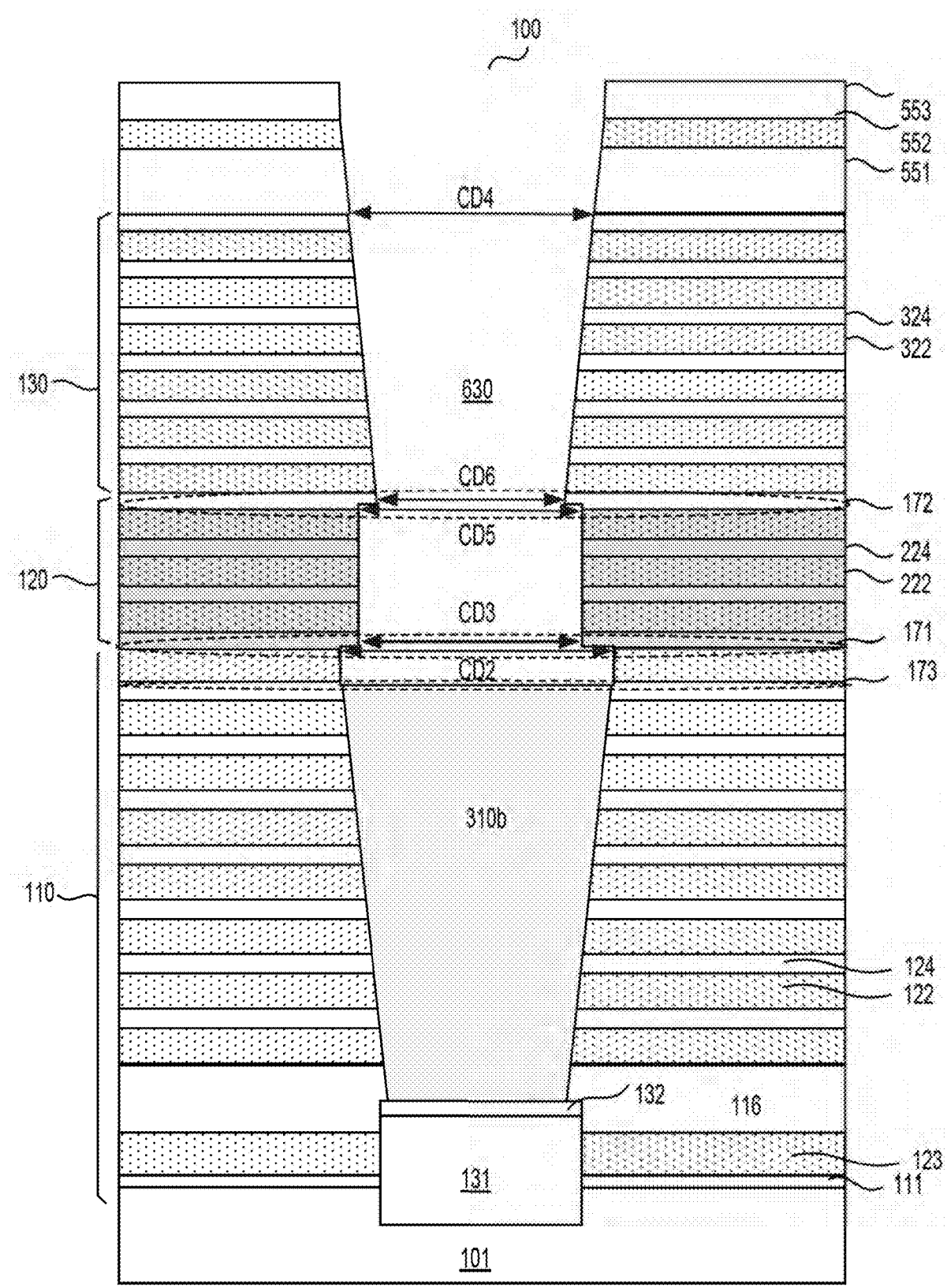

Referring to FIGS. 7 and 9, at step S960 of the process 900, the additional etch process near the boundary 171 is performed to remove the additional portion from the second stack 120. As a result, the second via 631 (including CD3$_{init}$) is enlarged and the initial discontinuity Δdinit at the boundary 171 is reduced to become the discontinuity Δd1. CD2$_{init}$ and CD3$_{init}$ become CD2 and CD3, respectively, after the additional etch process where CD2 and CD3 represent the critical dimensions above and below the boundary 171, respectively. CD2 can range from 90 to 160 nm, such as 120 nm. CD3 can range from 70 to 140 nm, such as 110 nm. CD4$_{init}$ becomes CD4. In an example, CD4 is similar or identical to CD4$_{init}$.

The additional etch process can also form one or more other discontinuities, such as the discontinuity Δd2 between CD5 and CD6 at the boundary 172 between the second via 631 and the third via 632, for example, because the second stack 120 has a different etch rate than that of the third stack 130. CD5 can range from 70 to 140 nm, such as 115 nm. CD6 can range from 70 to 140, such as 105 nm. The additional etch process can also etch a portion of the sacrificial layer 310b and/or a portion of the first stack 110, resulting in a discontinuity at a boundary 173 between different portions of the first via 230.

In an embodiment, the additional etch process can be a wet etch process, for example, based on a solution including hydrofluoric acid and tetramethylammonium hydroxide (TMAH). By adjusting the solution, such as a ratio of hydrofluoric acid over IMAH, an etching time, or the like, the additional etch process can etch the second stack 120 faster than adjacent structures, such as the third stack 130, the sacrificial layer 310b, and the first stack 110. In an example, the first stack 110 is minimally affected. According to aspects of the disclosure, due to the additional etch process, the discontinuity Δd1 is less than initial discontinuity Δdinit. The discontinuity Δd1 can be less than the threshold. The one or more other discontinuities, if formed, are also less than the initial discontinuity Δdinit. The one or more other discontinuities can also be less than the threshold. Therefore, a profile of the combined via 630 can have discontinuities, however, the discontinuities are relatively smooth, and thus, the layers subsequently formed in the channel structure 165 can have relatively uniform thicknesses.

Figure 8:
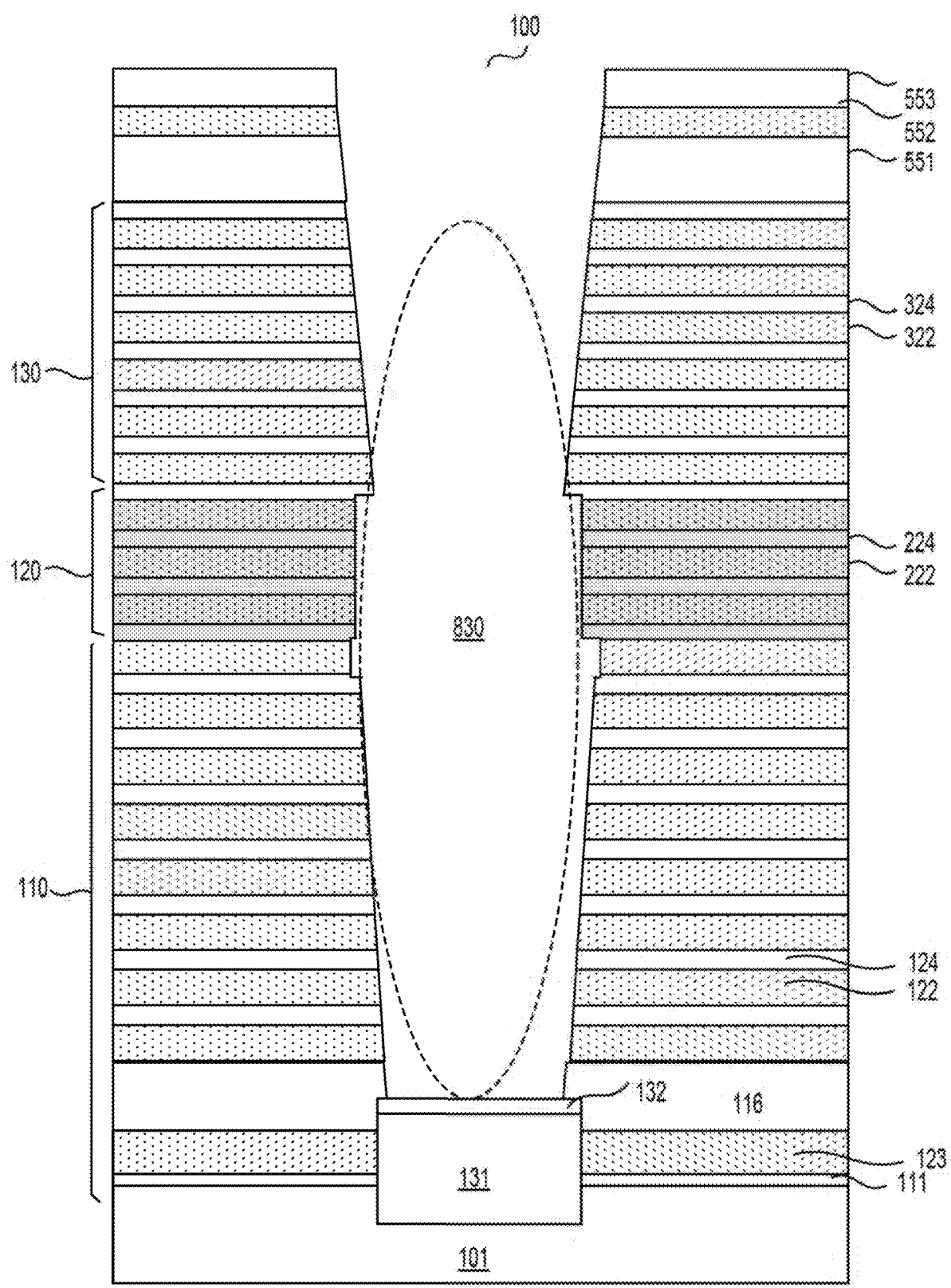
Figure 9:
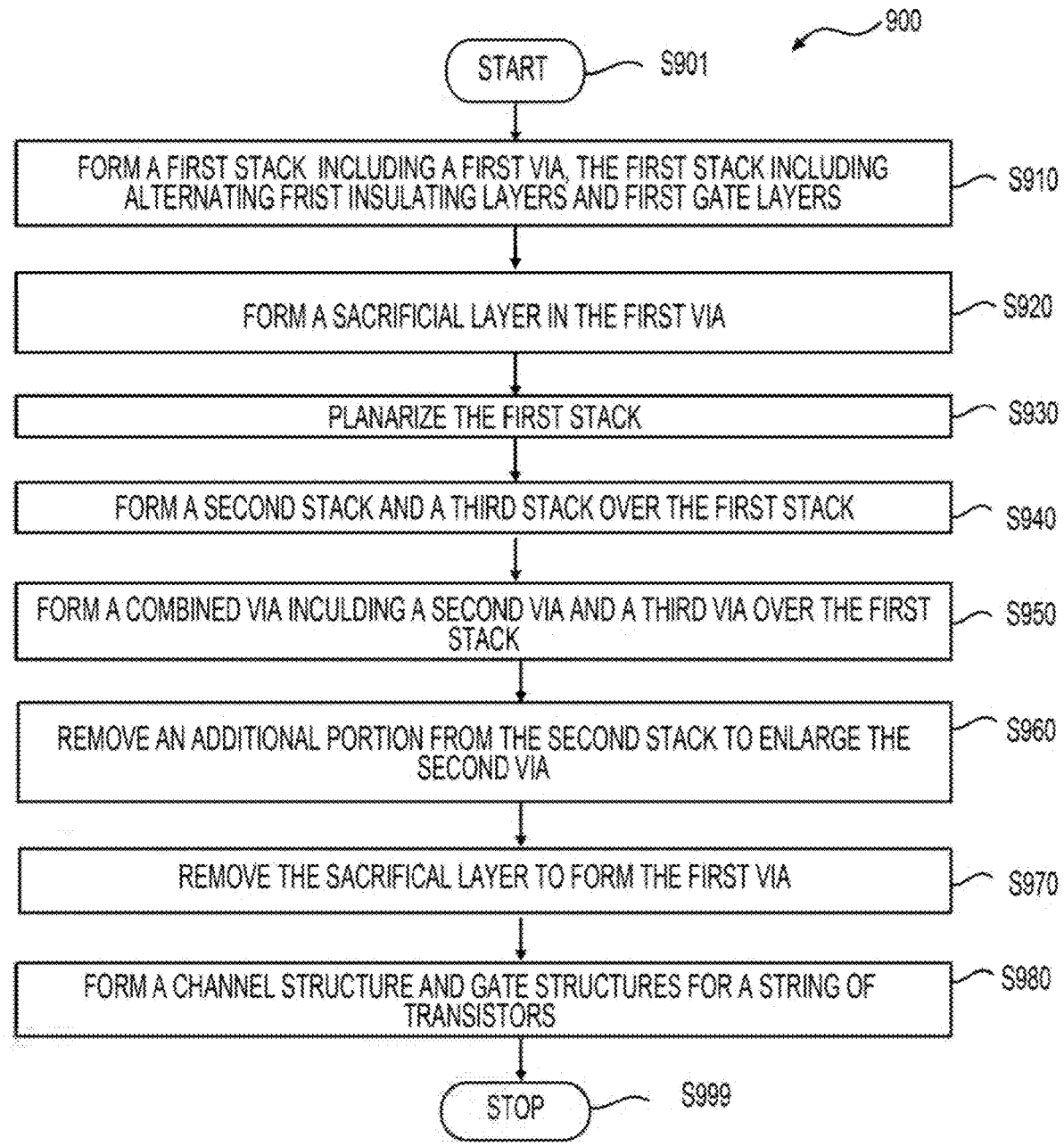
FIG. 9 shows a flow chart outlining an exemplary process for semiconductor fabrication according to an embodiment of the disclosure.

Referring to FIGS. 8 and 9, at step S970 of the process 900, the sacrificial layer 310b is removed from the first via 230 to form aa extended via 830 (also referred to a via 830). The via 830 includes the first, second, and third vias 230, 631, and 632. In various embodiments, an etching process, such as a wet etching, a dry, etching, or a combination thereof, is used to remove the sacrificial layer 310b. In an example, the etching process is a wet etching. The etching process can be selective to remove the one or more materials in the sacrificial layer 310b and minimally affect the first, second, and third stacks 110, 120, and 130 that surround the via 830. A profile of the via 830 can include relatively small discontinuities, such as the discontinuities Δd1 and Δd2 that are less than the initial discontinuity Δdinit and/or the threshold.

Referring to FIGS. 1 and 9, at step S980 of the process 900, the string 102 is formed by forming the channel structure 165 in the via 830, forming the second contact 139, and removing additional materials above the topmost third insulating layer 324 by, for example, a CMP. The string 102 as shown in FIG. 1 can be manufactured using a variety of semiconductor processing techniques, such as photolithography, CVD, PVD, ALD, dry etching, wet etching, CMP, ion implantation, and the like. In some embodiments, the first, second, and third gate layers 122, 222, and 322 and the layer 123 are removed and replaced with the respective gate structures 153a-153r including, for example, a high-K layer and a metal layer, such as W. Then, the process 900 proceeds to step S999, and terminates.

Of course, any suitable number of transistors can be stacked in the semiconductor device 100, depending on a capacity of the semiconductor device 100. As an example, the number of memory cells in the string 102 is 64, 128, and the like, and a thickness of the string 102 ranges from 8 to 12 microns.

Also additional steps can be provided before, during, and after the process 900, and one or more of the steps described above can be replaced, eliminated, adapted, and/or performed in different order for additional embodiments of the process 900. In an example, instead of being formed in step S910 as shown in FIG. 2, the first contact 131 can be formed after step S970 that removes the sacrificial layer 310b. Various additional interconnect structures (e.g., metallization layers having conductive lines and/or vias) may be formed over the semiconductor device 100. Such interconnect structure electrically connect the semiconductor device 100 with other contact structures and/or active devices to form functional circuits. Additional device features such as passivation layers, input/output structures, and the like may also be formed.

The process 900 can be combined with other process flows to manufacture other suitable semiconductor components (not shown), such as other types of transistors, bipolar junction transistors, resistors, capacitors, inductors, diodes, fuses, and the like, on the semiconductor device 100. In various embodiments, the process 900 can also be combined with additional process flows to manufacture other suitable circuits, for example, a peripheral circuit for driving the memory cells, a sense amplifier for reading data stored in the memory cells, a decoding circuit, and/or the like. The steps of the process 900, including any descriptions given with reference to FIGS. 2-9, are merely exemplary and are not intended to be limiting.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   filling a sacrificial layer in a first via of a first stack including alternating first insulating layers and first gate layers, the first stack being over a substrate of the semiconductor device, an initial top CD (CD$_{init}$) being larger than an initial bottom CD (CD1$_{init}$) of the first via;
   forming a second via of a second stack including alternating second insulating layers and second gate layers, the second stack being along a vertical direction over the first stack;
   forming a third via of a third stack including alternating third insulating layers and third gate layers, the third stack being along the vertical direction over the second stack, wherein the second insulating layers etch at a faster rate than the third insulating layers and the second gate layers etch at a faster rate than the third gate layers;

removing portions of the second stack and the third stack to form a combined via including the second via and the third via, the combined via being above the first via wherein an initial bottom CD ($CD3_{init}$) of the combined via is less than CD2init and an initial discontinuity is between $CD2_{init}$ and $CD3_{init}$;

etching an additional portion of the second stack to enlarge the second via and to reduce the initial discontinuity to a final discontinuity between a final bottom CD of the combined via and a final top CD of the first via wherein the second insulating layers etch at a faster rate than the third insulating layers and the second gate layers etch at a faster rate than the third gate layers; and removing the sacrificial layer from the first via.

2. The method according to claim 1, wherein the final discontinuity between the final bottom CD of the combined via and the final top CD of the first via is less than a threshold.

3. The method according to claim 2, wherein the threshold is between 0.05 and 0.15.

4. The method according to claim 1, wherein the forming the first via, the second via, and the third via further comprises:

while etching the additional portion of the second stack, removing an additional portion of the third stack, a discontinuity between a CD at a bottom side of the third via and a CD at a top side of the second via being smaller than the initial discontinuity between $CD_{init}$ and $CD3_{init}$.

5. The method according to claim 4, wherein the discontinuity between the CD at the bottom side of the third via and the CD at the top side of the second via is less than a threshold.

6. The method according to claim 5, wherein the threshold is between 0.05 and 0.15.

7. The method according to claim 1, wherein a volumetric mass density of the second insulating layers is lower than that of the third insulating layers.

8. The method according to claim 1, wherein a volumetric mass density of the second gate layers is lower than that of the third gate layers.

9. The method according to claim 1, wherein
the forming the second stack includes depositing silicon oxide as the second insulating layers by a high density plasma chemical vapor deposition; and
the forming the third stack includes forming silicon oxide as the third insulating layers from TEOS.

10. The method according to claim 8, wherein
the forming the second stack includes depositing polysilicon as the second gate layers by a high density plasma chemical vapor deposition; and
the forming the third stack includes forming silicon nitride as the third gate layers.

11. The method according to claim 1, wherein a material composition of the second insulating layers is different from a material composition of the third insulating layers.

12. The method according to claim 1, wherein a material composition of the second gate layers is different from a material composition of the third gate layers.

13. The method according to claim 1, further comprising:
forming a channel structure including a channel layer and a gate dielectric structure in a combined via that includes the first via, the second via, and the third via, the channel structure including a first portion, a second portion, and a third portion in the first via, the second via, and the third via, respectively; and
forming first gate structures, second gate structures, and third gate structures by replacing the first gate layers, the second gate layers, and the third gate layers with a gate metal material, respectively, the first portion, the second portion, and the third portion of the channel structure and the corresponding first gate structures, the second gate structures, and the third gate structures forming a first substring of transistors, a second substring of transistors, and a third substring of transistors of a string of transistors, respectively.

14. The method according to claim 13, wherein a ratio of a number of transistors in the second substring of transistors over a sum of the number of transistors in the second substring of transistors and a number of transistors in the third substring of transistors is between 10 and 30%.

15. The method according to claim 1, wherein the first insulating layers and the third insulating layers have an identical etch rate.

16. The method according to claim 1, wherein the first gate layers and the third gate layers have an identical etch rate.

* * * * *